United States Patent
Masuda et al.

(10) Patent No.: US 10,666,282 B2
(45) Date of Patent: May 26, 2020

(54) TRANSMISSION DEVICE, TRANSMISSION SYSTEM, AND ROBOT

(71) Applicant: Sony Corporation, Tokyo (JP)

(72) Inventors: Hiromasa Masuda, Tokyo (JP); Naoki Komine, Kanagawa (JP); Hirokazu Yasuda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/307,295

(22) PCT Filed: May 16, 2017

(86) PCT No.: PCT/JP2017/018325
§ 371 (c)(1),
(2) Date: Dec. 5, 2018

(87) PCT Pub. No.: WO2018/012102
PCT Pub. Date: Jan. 18, 2018

(65) Prior Publication Data
US 2019/0149161 A1 May 16, 2019

(30) Foreign Application Priority Data
Jul. 11, 2016 (JP) .................................. 2016-136550

(51) Int. Cl.
*H03M 1/20* (2006.01)
*B25J 19/00* (2006.01)
*G06F 13/42* (2006.01)
*H03M 9/00* (2006.01)

(52) U.S. Cl.
CPC .............. *H03M 1/20* (2013.01); *B25J 19/00* (2013.01); *G06F 13/4282* (2013.01); *H03M 9/00* (2013.01)

(58) Field of Classification Search
CPC ........ H03M 1/20; H03M 9/00; H03M 1/0641; H03M 2201/835; H03M 3/33; H03M 3/332; G06F 13/4282; B25J 19/00
USPC ......................................... 341/131, 100, 101
See application file for complete search history.

(56) References Cited

U.S. PATENT DOCUMENTS

| | | | | |
|---|---|---|---|---|
| 5,185,736 A * | 2/1993 | Tyrrell | ...................... | H04J 3/08 370/358 |
| 5,834,916 A | 11/1998 | Shimogama et al. | | |
| 8,964,862 B2 * | 2/2015 | Himmelstoss | .......... | H03L 7/197 375/257 |
| 9,525,908 B2 * | 12/2016 | Kitano | ................... | H04N 5/775 |
| 9,949,639 B2 * | 4/2018 | Sicurello | ................. | H04Q 9/00 |
| 2006/0193348 A1 * | 8/2006 | Unno | ..................... | H04H 20/28 370/535 |

(Continued)

FOREIGN PATENT DOCUMENTS

| | | |
|---|---|---|
| JP | 5-27821 A | 2/1993 |
| JP | 5-80848 A | 4/1993 |
| JP | 5-113809 A | 5/1993 |

(Continued)

OTHER PUBLICATIONS

International Search Report dated Aug. 8, 2017 in PCT/JP2017/018325, 2 pages.

*Primary Examiner* — Jean B Jeanglaude
(74) *Attorney, Agent, or Firm* — Xsensus LLP

(57) ABSTRACT

There is provided a transmission device configured to serialize data of a change amount that is based on a signal acquired from a sensor, and transmit the data by simplex communication.

10 Claims, 4 Drawing Sheets

(56) References Cited

U.S. PATENT DOCUMENTS

2007/0075869 A1* 4/2007 Vazach .............. G05B 19/0425
340/679
2014/0341584 A1* 11/2014 Hopewell .............. H04B 10/80
398/104

FOREIGN PATENT DOCUMENTS

| JP | 6-250715 A | 9/1994 |
| JP | 9-66490 A | 3/1997 |
| JP | 2008-126328 A | 6/2008 |
| JP | 2008-128861 A | 6/2008 |
| JP | 2010-82784 A | 4/2010 |
| JP | 2012-88281 A | 5/2012 |
| JP | 2015-89577 A | 5/2015 |

* cited by examiner

TRANSMISSION DEVICE, TRANSMISSION SYSTEM, AND ROBOT

TECHNICAL FIELD

The present disclosure relates to a transmission device, a transmission system, and a robot.

BACKGROUND ART

For example, there is developed a technology for achieving wire saving in a parallel link stage including a parallel link mechanism that is used in a robot or the like. As a technology for achieving the above-described wire saving by using serial communication, for example, there is a technology described in Patent Literature 1 described below.

CITATION LIST

Patent Literature

Patent Literature 1: JP 2010-82784A

DISCLOSURE OF INVENTION

Technical Problem

For example, in the technology described in Patent Literature 1, a serial bus such as EtherCAT (registered trademark) is used. Nevertheless, in the case of transmitting data that is based on a signal acquired from a sensor, using the above-described serial bus, the following shortcomings can be generated.

A delay time in the transmission of data is large

As the number of sensors increases, a delay time increases

Temporal synchronization processing is required between a transmission device and a receiving device that are related to the transmission that uses a serial bus Because packet communication is performed, delay is caused by processing related to the packet communication, and hardware cost and software cost increase In addition, in a case where a signal acquired from a sensor is an analog signal, in a transmission device related to the transmission that uses a serial bus, analog-to-digital conversion of the analog signal is performed, and the transmission of the data is performed. In addition, in a receiving device related to the transmission that uses a serial bus, received data is assumed to be subjected to digital-to-analog conversion. Nevertheless, as described above, "in a case where the analog-to-digital conversion is performed in the transmission device and the digital-to-analog conversion is performed in the receiving device when data that is based on a signal acquired from a sensor is transmitted using the above-described serial bus", the following shortcomings can be further generated.

A delay time in the transmission of data is large (e.g. because delay caused by a time required for the analog-to-digital conversion, and delay caused by a time required for completion of transfer of all bits are generated)

Because a control circuit for switching a bus is required, a circuit scale is enlarged The present disclosure proposes a transmission device, a transmission system, and a robot that are novel and improved, and can transmit data that is based on a signal acquired from a sensor.

Solution to Problem

According to the present disclosure, there is provided a transmission device configured to serialize data of a change amount that is based on a signal acquired from a sensor, and transmit the data by simplex communication.

In addition, according to the present disclosure, there is provided a transmission system including: a transmission device configured to serialize data of a change amount that is based on a signal acquired from a sensor, and transmit the data by simplex communication; and a receiving device configured to receive data transmitted by the simplex communication, and deserialize the data.

In addition, according to the present disclosure, there is provided a robot including: a robot arm having one end connected to a main body, another end that is made movable, and a sensor provided on the other end side; a transmission device that is provided on the other end side of the robot arm, and configured to serialize data of a change amount that is based on a signal acquired from the sensor, and transmit the data by simplex communication; and a receiving device configured to receive data transmitted by the simplex communication, and deserialize the data.

Advantageous Effects of Invention

According to the present disclosure, data that is based on a signal acquired from a sensor can be transmitted.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
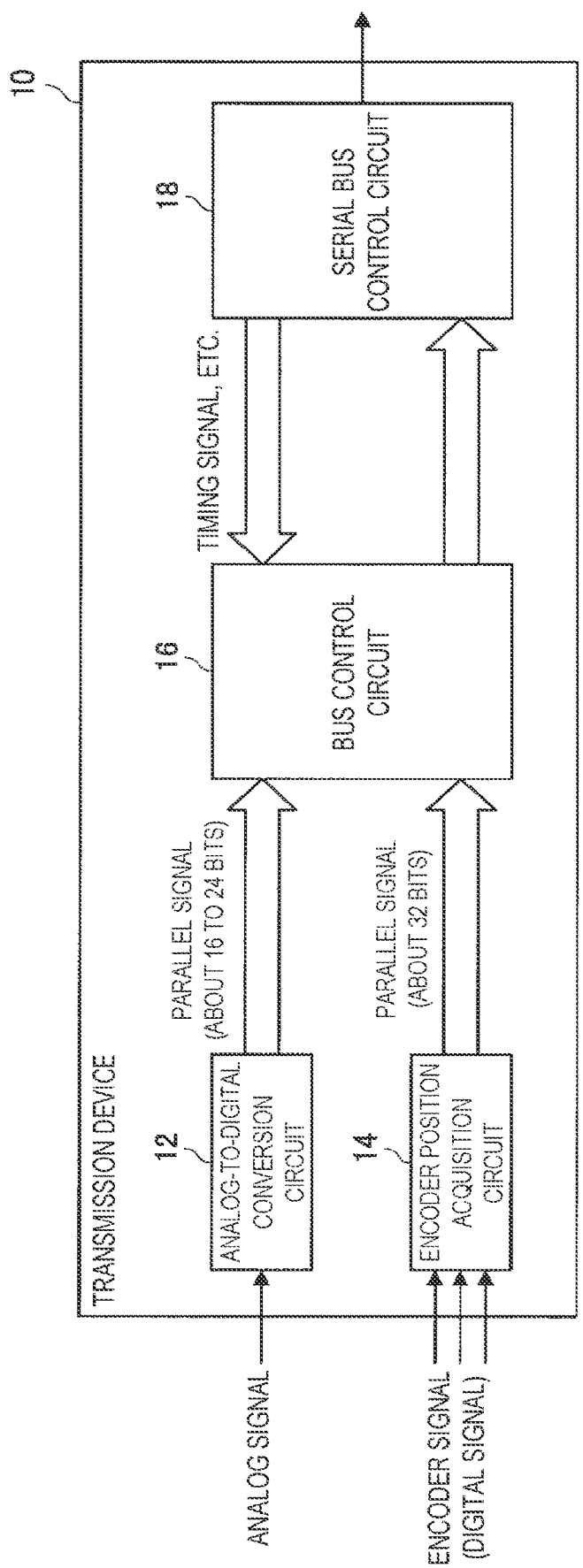
FIG. 1 is an explanatory diagram illustrating an example of a configuration of a transmission device in a case where data that is based on a signal acquired from a sensor is transmitted via a serial bus.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

In addition, hereinafter, the description will be given in the order indicated below.

1. Transmission System According to Present Embodiment
2. Application Example of Transmission System According to Present Embodiment

Transmission System According to Present Embodiment

[1] About a Case where Data that is Based on a Signal Acquired from a Sensor is Transmitted Via a Serial Bus Before a configuration of a transmission system according to the present embodiment will be described, a case where data that is based on a signal acquired from a sensor is transmitted via a serial bus will be described.

FIG. 1 is an explanatory diagram illustrating an example of a configuration of a transmission device 10 in a case where data that is based on a signal acquired from a sensor is transmitted via a serial bus.

FIG. 1 illustrates an example of the configuration of the transmission device 10 that transmits, via a serial bus, a signal acquired from each of a sensor that outputs, as an analog signal, a sensing result of a microphone, an acceleration sensor, or the like, and an incremental encoder (an example of a sensor that outputs a sensing result as a digital signal). In FIG. 1, for the sake of convenience, a digital signal acquired from the incremental encoder is illustrated as an "encoder signal" (the same applies to the other drawings.).

The transmission device 10 and each sensor such as an incremental encoder are connected in a wired manner by a signal line, for example, and a signal output by each sensor is acquired via the signal line. Note that the transmission device 10 may acquire a signal output by each sensor, by performing radio communication of an arbitrary communication method with each sensor.

The transmission device 10 includes, for example, an analog-to-digital conversion circuit 12, an encoder position acquisition circuit 14, a bus control circuit 16, and a serial bus control circuit 18.

The analog-to-digital conversion circuit 12 converts a signal acquired from a sensor that outputs an analog signal, into a digital signal. As the analog-to-digital conversion circuit 12, for example, there is a successive-approximation type analog-to-digital conversion circuit or the like.

On the basis of a plurality of encoder signals acquired from an incremental encoder, the encoder position acquisition circuit 14 identifies positions detected in the incremental encoder, and acquires position information (data) indicating the positions. In other words, the encoder position acquisition circuit 14 converts an encoder signal acquired from the incremental encoder, into position information.

The bus control circuit 16 is a control circuit for switching a bus. The bus control circuit 16 switches a bus on the basis of a timing signal or the like that is transmitted from the serial bus control circuit 18.

The serial bus control circuit 18 is a control circuit for controlling communication performed via a serial bus.

By the configurations illustrated in FIG. 1, for example, the transmission device 10 transmits data that is based on a signal acquired from a sensor, via a serial bus.

In addition, a receiving device (not illustrated) for receiving data transmitted from the transmission device 10 via a serial bus, via the serial bus includes a serial bus control circuit and a bus control circuit that have similar functions to those in the transmission device 10 illustrated in FIG. 1. In addition, the receiving device (not illustrated) may further include a digital-to-analog conversion circuit for performing digital-to-analog conversion of the received data. As the digital-to-analog conversion circuit, for example, there is a pulse width modulation-type digital-to-analog conversion circuit or the like.

Then, in the transmission device 10 and the receiving device (not illustrated), by duplex communication being performed via a serial bus between the serial bus control circuit included in the transmission device 10, and the serial bus control circuit included in the receiving device (not illustrated), data that is based on a signal acquired from a sensor is transmitted via the serial bus.

Nevertheless, as described above, in the case of transmitting data that is based on a signal acquired from a sensor, using a serial bus, the following shortcomings can be generated.

A delay time in the transmission of data is large

As the number of sensors increases, a delay time increases

Temporal synchronization processing is required between the transmission device 10 and the receiving device (not illustrated)

Because packet communication is performed, delay is caused by processing related to the packet communication, and hardware cost and software cost increase In addition, as illustrated in FIG. 1, in a case where signals acquired from sensors include an analog signal, in the transmission device 10, analog-to-digital conversion of the analog signal is performed, and the transmission of the data is performed. In addition, as described above, the receiving device (not illustrated) related to the transmission that uses a serial bus can include a digital-to-analog conversion circuit for performing digital-to-analog conversion of received data. Nevertheless, as described above, in a case where the analog-to-digital conversion is performed in the transmission device 10 and the digital-to-analog conversion is performed in the receiving device (not illustrated), the following shortcomings can be further generated.

A delay time in the transmission of data is large

Because a control circuit for switching a bus is required, a circuit scale is enlarged Furthermore, in a case where an incremental encoder is included in sensors as illustrated in FIG. 1, the transmission device 10 needs to include the encoder position acquisition circuit 14 for converting an encoder signal into position information. In addition, in the transmission device 10, a delay time in the transmission of data increases by an amount corresponding to resolution capability of position information acquired by the encoder position acquisition circuit 14. As an example, in a case where the encoder position acquisition circuit 14 converts a 32-bit encoder signal into 64-bit position information, a delay time increases by an amount corresponding to 32 bits.

[2] The Configuration of the Transmission System According to the Present Embodiment In view of the foregoing, in the transmission system according to the present embodiment, a transmission device according to the present embodiment serializes data of a change amount that is based on a signal acquired from a sensor (hereinafter, simply indicated as "data of a change amount" in some cases.), and transmits the data by simplex communication. In addition, in the transmission system according to the present embodiment, a receiving device according to the present embodiment receives data transmitted from the transmission device according to the present embodiment by simplex communication, and deserializes the data.

For example, one or two or more sensors are connected to the transmission device according to the present embodiment in a wired manner by a signal line. Then, the transmission device according to the present embodiment acquires a signal output by each of the one or two or more sensors, via the above-described connected signal line.

In addition, the transmission device according to the present embodiment may acquire a signal output by each of the one or two or more sensors, by performing radio communication of an arbitrary communication method with each of the one or two or more sensors.

Hereinafter, a case where the transmission device according to the present embodiment acquires a signal output by a sensor, via a signal line is used as an example.

Here, as the sensor according to the present embodiment, either one or both of a sensor that outputs a digital signal indicating a change amount (digital signal indicating a sensing result), and a sensor that outputs an analog signal indicating a change amount (analog signal indicating a sensing result) are used. An example of the sensor that outputs a digital signal according to the present embodiment, and an example of the sensor that outputs an analog signal according to the present embodiment will be described later.

Hereinafter, a case where the transmission device according to the present embodiment acquires signals respectively output by a plurality of sensors including both of a sensor that outputs a digital signal, and a sensor that outputs an analog signal is used as an example.

Figure 2:
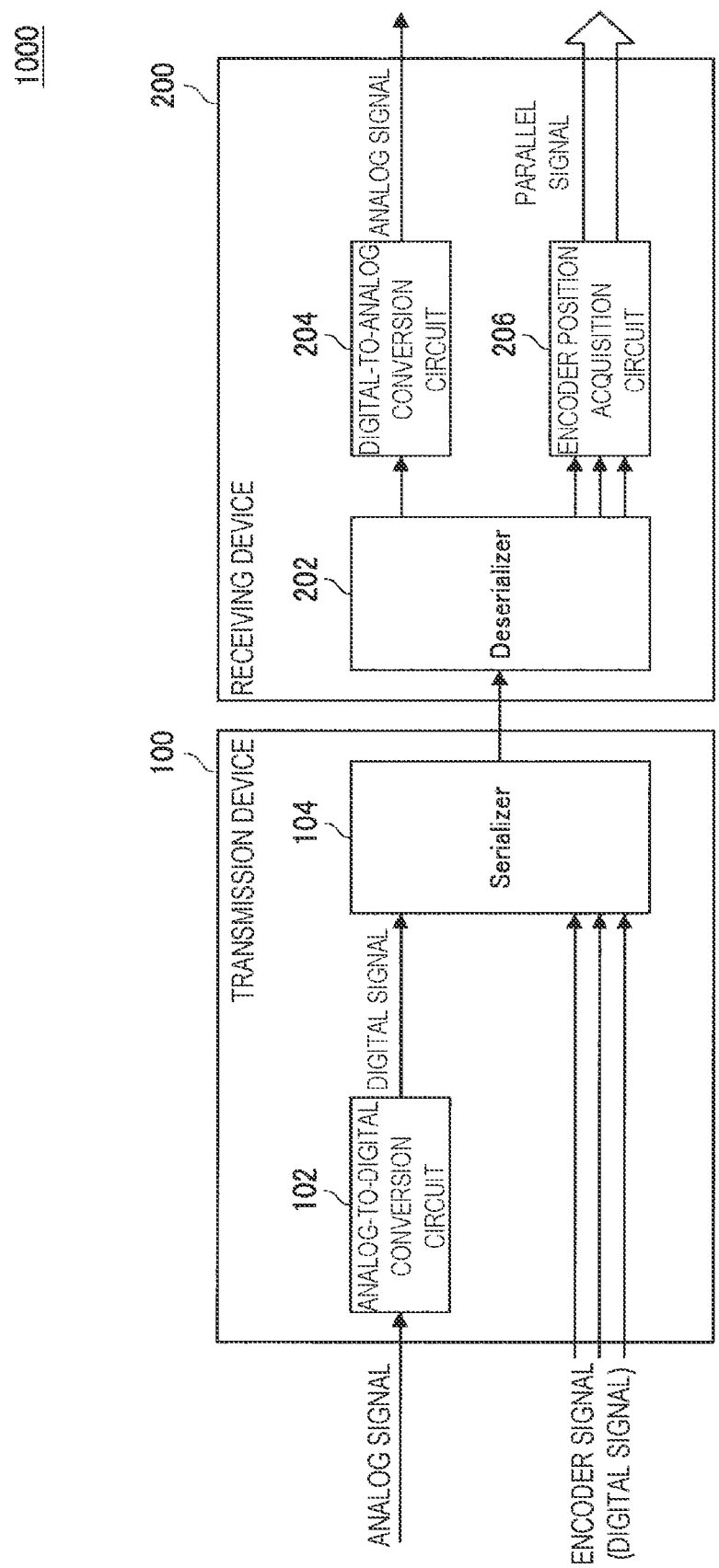
FIG. 2 is an explanatory diagram illustrating an example of a configuration of a transmission system according to the present embodiment.

FIG. 2 is an explanatory diagram illustrating an example of a configuration of a transmission system 1000 according to the present embodiment.

The transmission system 1000 includes a transmission device 100 according to the present embodiment and a receiving device 200 according to the present embodiment.

The transmission device 100 and the receiving device 200 are connected in a wired manner by a signal line such as a local area network (LAN) cable, for example. Then, in the transmission system 1000, by an arbitrary wired communication method that can perform simplex communication from the transmission device 100 to the receiving device 200, data of a change amount is transmitted from the transmission device 100 to the receiving device 200.

As described above, the transmission device according to the present embodiment serializes data of a change amount, and transmits the data by simplex communication. Therefore, in the transmission system 1000, the number of signal lines for connecting the transmission device 100 and the receiving device 200 can be one. Here, as one signal line according to the present embodiment, for example, there is a physically one signal line or one pair of signal lines. In a case where the one signal line according to the present embodiment is one pair of signal lines, data of a change amount is transmitted as a differential signal. Note that, in the transmission system 1000, needless to say, the number of signal lines for connecting the transmission device 100 and the receiving device 200 can be two or more.

In addition, in the transmission system 1000, by an arbitrary radio communication method that can perform simplex communication from the transmission device 100 to the receiving device 200, data of a change amount may be wirelessly transmitted from the transmission device 100 to the receiving device 200. As an example of radio communication applied to the transmission of data of a change amount in the transmission system 1000, for example, there is optical communication.

[2-1] The Transmission Device 100

The transmission device 100 serializes data of a change amount that is based on a signal acquired from a sensor, and transmits the data by simplex communication.

The transmission device 100 includes, for example, an analog-to-digital conversion circuit 102 and a serializer 104. The transmission device 100 is driven by electric power supplied from an internal power source (not illustrated) such as a battery, or electric power supplied from an external power source of the transmission device 100.

FIG. 2 illustrates an example where a sensor that outputs one analog signal, and one incremental encoder (incremental encoder that outputs three encoder signals) are connected to the transmission device 100 by signal lines.

Note that signals to be acquired by the transmission device 100 from sensors are not limited to the examples illustrated in FIG. 2.

Figure 3:
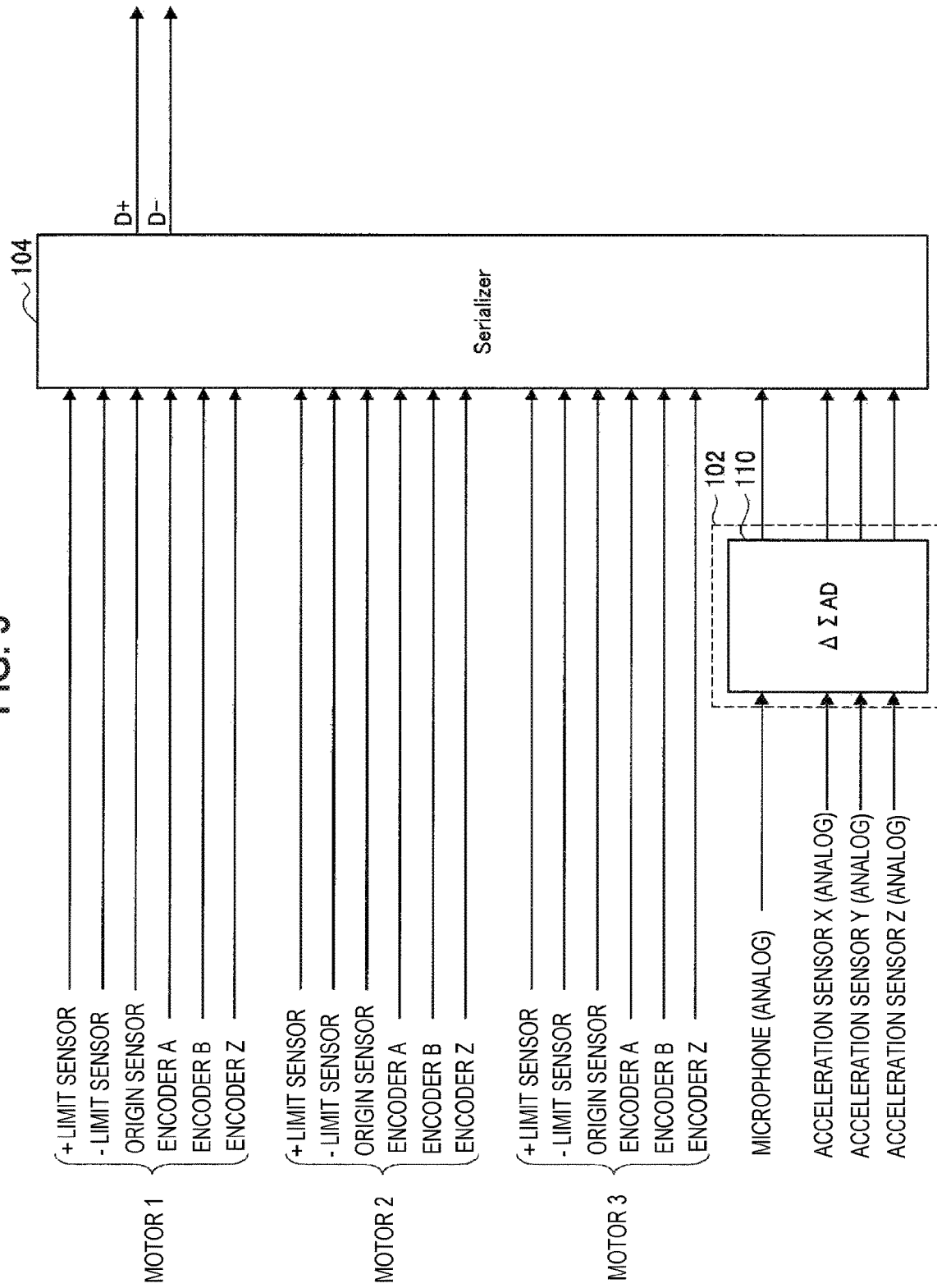
FIG. 3 is an explanatory diagram illustrating an example of a configuration of a transmission device according to the present embodiment.

FIG. 3 is an explanatory diagram illustrating an example of a configuration of the transmission device 100 according to the present embodiment. FIG. 3 illustrates, as sensors according to the present embodiment, a plurality of sensors corresponding to each of a motor 1, a motor 2, and a motor 3, a microphone, and translational three-axis acceleration sensors.

FIG. 3 illustrates, as a plurality of sensors corresponding to each motor, limit sensors, an origin sensor, and incremental encoders. A plurality of sensors corresponding to each motor is an example of a sensor that outputs a digital signal indicating a change amount. In the example illustrated in FIG. 3, the transmission device 100 acquires six digital signals from a plurality of sensors corresponding to a motor. In addition, in the example illustrated in FIG. 3, 18 digital signals in total that are acquired from pluralities of sensors respectively corresponding to the motor 1, the motor 2, and the motor 3 correspond to data of a change amount that is based on a signal acquired from a sensor that outputs a digital signal.

In addition, the microphone and the translational three-axis acceleration sensors that are illustrated in FIG. 3 serve as an example of a sensor that outputs an analog signal indicating a change amount. In the example illustrated in FIG. 3, the transmission device 100 acquires four analog signals from the microphone and the translational three-axis acceleration sensors.

Hereinafter, for the sake of convenience of the description, an example of a configuration of the transmission device 100 will be described with reference to FIG. 3. Note that signals to be acquired by the transmission device 100 from sensors are not limited to the examples illustrated in FIGS. 2 and 3. For example, the transmission device 100 can acquire signals output from various sensors such as an absolute encoder and a force sensor.

[2-1-1] The Analog-To-Digital Conversion Circuit 102

The analog-to-digital conversion circuit 102 converts a signal acquired from a sensor that outputs an analog signal, into a digital signal. The digital signal converted by the analog-to-digital conversion circuit 102 corresponds to data of a change amount that is based on a signal acquired from a sensor that outputs an analog signal.

As the analog-to-digital conversion circuit 102, for example, there is a delta sigma type analog-to-digital converter 110. The delta sigma type analog-to-digital converter 110 converts four analog signals acquired from the microphone and the translational three-axis acceleration sensors, into four digital signals.

As illustrated in FIG. 3, in a case where the analog-to-digital conversion circuit 102 is the delta sigma type analog-to-digital converter 110, analog signals acquired from the sensors are converted into one-bit digital signals. Therefore, in a case where the analog-to-digital conversion circuit 102 is the delta sigma type analog-to-digital converter 110, data of a change amount that is based on analog signals acquired from the sensors can be transmitted with low delay.

In addition, the delta sigma type analog-to-digital converter 110 can be implemented by a smaller-scale circuit than an analog-to-digital conversion circuit of another type. Therefore, in a case where the analog-to-digital conversion circuit 102 is the delta sigma type analog-to-digital converter 110, downscaling of the analog-to-digital conversion circuit 102 can be achieved.

Note that the analog-to-digital conversion circuit 102 is not limited to the delta sigma type analog-to-digital converter 110. For example, the analog-to-digital conversion circuit 102 may be an analog-to-digital conversion circuit of an arbitrary type, such as a successive-approximation type analog-to-digital conversion circuit.

Digital signals converted by the analog-to-digital conversion circuit 102 are transmitted to the serializer 104. In addition, as described later, in the serializer 104, the transmitted data of a change amount is serialized. In other words, data of a change amount that is to be serialized in the transmission device 100 having the configuration illustrated in FIG. 3 includes data converted by the analog-to-digital conversion circuit 102.

[2-1-2] The Serializer 104

The serializer 104 serializes data of a change amount, and transmits the serialized data by simplex communication. As the serializer 104, for example, there is a circuit (or an integrated circuit (IC)) having an arbitrary configuration that can serialize an input parallel signal, and transmit a serial signal via a transmission path.

In the example illustrated in FIG. 3, 22 digital signals (18 digital signals acquired from the pluralities of sensors respectively corresponding to the motor 1, the motor 2, and the motor 3, and four digital signals transmitted from the delta sigma type analog-to-digital converter 110) are input to the serializer 104. Then, the serializer 104 serializes the input 22 digital signals in accordance with a predetermined clock such as 50 [mhz], and transmits the serialized signals by simplex communication.

Here, for example, in a case where a clock in the serializer 104 is 50 [mhz], a delay time between the transmission device 100 and the receiving device 200 (a delay time between the serializer 104 and a deserializer 202 to be described later) is about 5.7 [μs]. In addition, the serializer 104 can theoretically transmit a signal up to a clock frequency. Note that, needless to say, the predetermined clock in the serializer 104 is not limited to 50 [mhz].

The transmission device 100 includes, for example, configurations illustrated in FIGS. 2 and 3.

Here, the transmission device 100 serializes data of a change amount by the serializer 104, and transmits the data by simplex communication.

Therefore, the transmission device 100 has the following advantages (merits) as compared with the transmission device 10 in the case of transmitting data that is based on a signal acquired from a sensor, using a serial bus.

A delay time in the transmission of data is small

Even if the number of sensors increases, an increase in delay time can be suppressed Temporal synchronization processing is not required between the transmission device 100 and the receiving device 200

Because packet communication is not performed, delay is not caused by processing related to the packet communication, and increases in hardware cost and software cost that are related to the packet communication are not caused Because a control circuit for switching a bus is not required, a circuit scale is small Even in a case where an incremental encoder is included in sensors, the transmission device 100 needs not include an encoder position acquisition circuit for converting an encoder signal into position information (i.e. the transmission device 100 can employ a configuration of directly serializing an encoder signal output from an incremental encoder)

Note that the configurations of the transmission device according to the present embodiment are not limited to the examples illustrated in FIGS. 2 and 3.

For example, in a case where the transmission device according to the present embodiment does not acquire a signal output by a sensor that outputs an analog signal, the transmission device according to the present embodiment can employ a configuration not including the analog-to-digital conversion circuit 102.

[2-2] The Receiving Device 200

The receiving device 200 receives data transmitted by simplex communication, and deserializes the data.

Hereinafter, using FIG. 2 as an example, an example of a configuration of the receiving device 200 will be described. Here, the receiving device 200 illustrated in FIG. 2 is a receiving device corresponding to the transmission device 100 illustrated in FIG. 2.

As illustrated in FIG. 2, the receiving device 200 includes, for example, the deserializer 202, a digital-to-analog conversion circuit 204, and an encoder position acquisition circuit 206.

[2-2-1] The Deserializer 202

The deserializer 202 receives data transmitted from the serializer 104 of the transmission device 100 by simplex communication, and deserializes the data.

As the deserializer 202, for example, there is a circuit (or IC) having an arbitrary configuration that can deserialize an input serial signal, and convert the serial signal into a parallel signal.

[2-2-2] The Digital-To-Analog Conversion Circuit 204

The digital-to-analog conversion circuit 204 converts a digital signal transmitted from the deserializer 202, into an analog signal. As the digital-to-analog conversion circuit, for example, there is a digital-to-analog conversion circuit of an arbitrary type, such as a pulse width modulation-type digital-to-analog conversion circuit.

On the basis of a plurality of encoder signals transmitted from the deserializer 202, the encoder position acquisition circuit 206 identifies positions detected in an incremental encoder, and acquires position information indicating the positions. Here, the plurality of encoder signals transmitted from the deserializer 202 are signals acquired by the transmission device 100 illustrated in FIG. 2, from an incremental encoder. In other words, the encoder position acquisition circuit 206 converts encoder signals acquired from an incremental encoder via the transmission device 100, into position information.

The receiving device 200 includes, for example, configurations illustrated in FIG. 2.

Note that the configurations of the receiving device according to the present embodiment are not limited to the examples illustrated in FIG. 2.

For example, the receiving device according to the present embodiment can employ a configuration corresponding to a sensor from which the transmission device according to the present embodiment acquires a signal (i.e. configuration corresponding to the transmission device according to the present embodiment). As an example, in a case where the transmission device according to the present embodiment does not acquire a signal output by a sensor that outputs an analog signal, the receiving device according to the present embodiment needs not include the digital-to-analog conversion circuit 204. In addition, as another example, in a case where the transmission device 100 has a configuration of not receiving a signal from an incremental encoder, the receiving device according to the present embodiment needs not include the encoder position acquisition circuit 206.

[2-3] Effects Caused by the Transmission System According to the Present Embodiment As illustrated in FIG. 2, for example, the transmission system 1000 according to the present embodiment includes the transmission device 100 according to the present embodiment and the receiving device 200 according to the present embodiment.

In the transmission system 1000, by including the transmission device 100, data of a change amount that is based on a signal acquired from a sensor is serialized, and transmitted by simplex communication from the transmission device 100 to the receiving device 200.

Therefore, in the transmission system 1000, the transmission of data that is based on a signal acquired from a sensor is implemented.

In addition, in the transmission system 1000, for example, the following effects are caused. Note that, needless to say, effects caused in the transmission system 1000 are not limited to the examples indicated below.

In a case where the transmission device 100 and the receiving device 200 perform communication in a wired manner, wire saving is achieved Because it becomes possible to connect the transmission device 100 and the receiving device 200 by one signal line, by the wire saving, for example, the detection of break of the signal line becomes easier. Note that processing related to the detection of break may be performed by the receiving device 200, or may be performed by a processing device that processes data received by the receiving device 200 (e.g. a processor, a signal processing module to be described later, etc.).

Lower delay in the transmission of data of a change amount from the transmission device 100 to the receiving device 200 is achieved Application Example of Transmission System According to Present Embodiment Next, an application example of the transmission system according to the present embodiment described above will be described.

[I] A First Application Example: Robot

Figure 4:
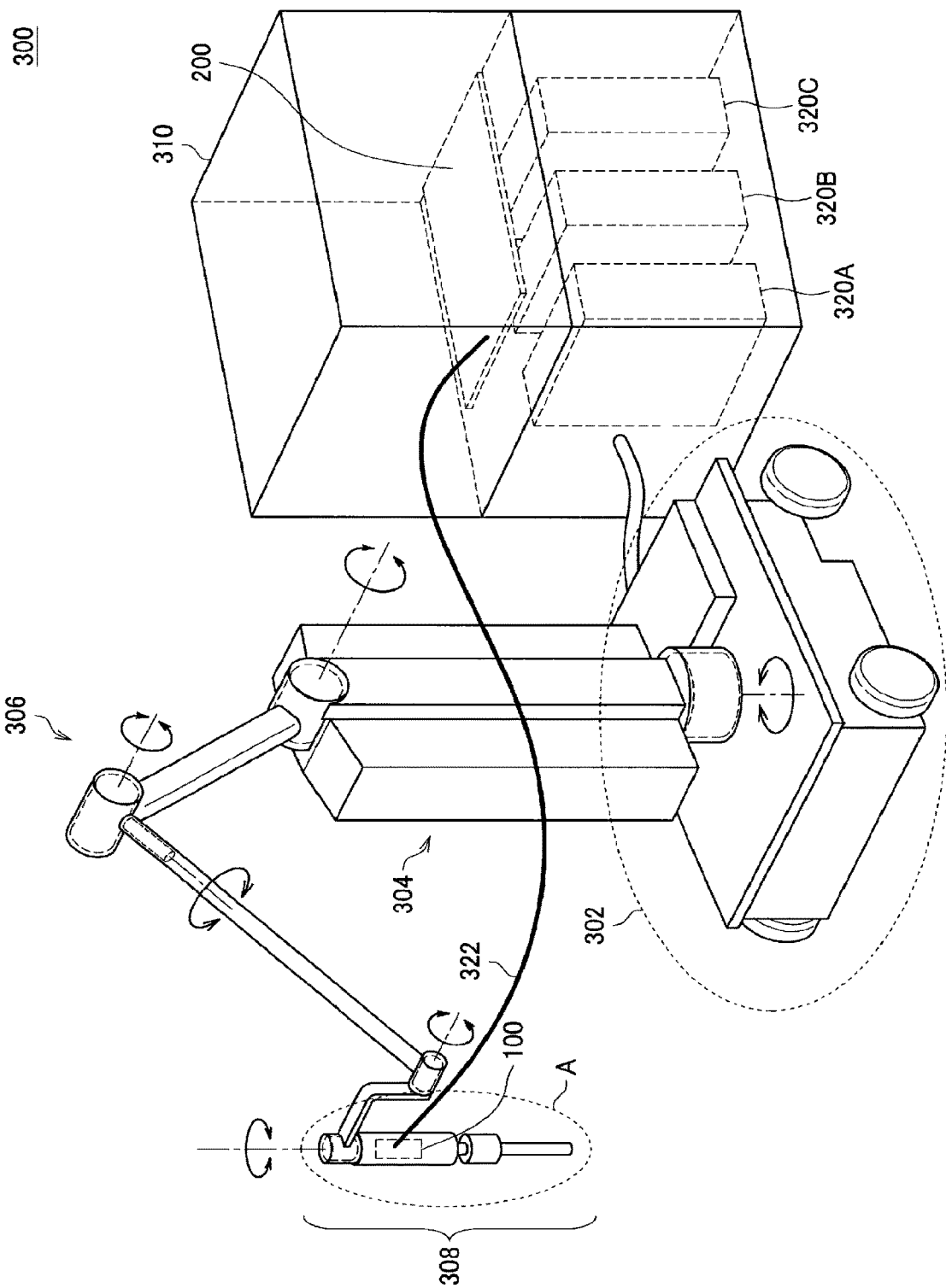
FIG. 4 is an explanatory diagram illustrating an application example of the transmission system according to the present embodiment.

FIG. 4 is an explanatory diagram illustrating an application example of the transmission system 1000 according to the present embodiment, and illustrates an example where the transmission system 1000 is applied to a robot 300 including a robot arm.

The robot 300 include, for example, a base 302, a main body 304, a robot arm 306, one or two or more sensors 308, an accommodation member 310, the transmission device 100, and the receiving device 200. The robot 300 is driven by electric power supplied from an internal power source (not illustrated) such as a battery, or electric power supplied from an external power source of the robot 300.

The transmission device 100 and the receiving device 200 are connected in a wired manner by a signal line 322. Here, the signal line 322 may be accommodated inside a casing of the robot arm, and connected to the receiving device 200 in a wired manner. In a case where the signal line 322 is accommodated inside the casing of the robot arm, because the signal line 322 is accommodated inside the casing of the robot arm, sterilization processing of the signal line 322 itself becomes easy. Note that, as described above, the transmission device 100 and the receiving device 200 may have a configuration of performing radio communication.

In addition, the robot 300 may include, for example, a motor (or an actuator. The same applied to the following.) for moving the robot 300. As a motor included in the robot 300, for example, there is a motor for rotationally moving the robot arm 306 to be described later, or the like.

Here, as the robot 300, for example, there is a robot corresponding to a device on a slave side in a bilateral system. In a case where the robot 300 corresponds to a device on a slave side in a bilateral system, the robot 300 moves on the basis of a movement of a robot (not illustrated) corresponding to a device on a master side in the bilateral system. In addition, in a case where the robot 300 corresponds to a device on a slave side in a bilateral system, a signal (hereinafter, sometimes indicated as a "sensor signal".) indicating a detection result of the sensors 308 provided at a tip portion (A illustrated in FIG. 4) of the robot arm 306 may be transmitted from the robot 300 to a robot (not illustrated) corresponding to a device on a master side, for example. By receiving the sensor signal, the robot (not illustrated) corresponding to the device on the master side can perform, for example, various controls that are based on the received sensor signal, feedback to an operator or the like of the robot (not illustrated) that is based on the received sensor signal, and the like. Note that, needless to say, a robot to which the transmission system according to the present embodiment is applied is not limited to a robot corresponding to a device on a slave side in a bilateral system.

The base 302 fulfills a role of supporting the main body 304, and functions as a base in the robot 300.

One end of the robot arm 306 is connected to the main body 304.

The robot arm 306 has one end connected to the main body 304 and another end that is made movable. The robot arm 306 corresponds to an operational portion in the robot 300. In the example illustrated in FIG. 4, by a portion of the robot arm 306 that is connected to the main body 304 performing a rotational operation or the like, the other end of the robot arm 306 moves.

In addition, the one or two or more sensors 308 are provided at the tip portion (A illustrated in FIG. 4) on the other end side of the robot arm 306. As the sensors 308, there are various kinds of sensors illustrated with reference to FIG. 3, and various sensors such as an absolute encoder and a force sensor.

The transmission device 100 is provided on the other end side of the robot arm 306. FIG. 4 illustrates an example where a substrate on which an IC functioning as the transmission device 100 is mounted is provided at the tip portion (A illustrated in FIG. 4) on the other end side of the robot arm 306.

As described above, the transmission device 100 serializes data of a change amount that is based on a signal acquired from each of the one or two or more sensors 308, and transmits the data by simplex communication.

The accommodation member 310 is connected to the main body 304. In the accommodation member 310, for example, drivers 320A, 320B, and 320C for driving the robot 300 are accommodated. As the drivers 320A, 320B, and 320C, for example, there is a servo driver. By driving a motor (not illustrated) included in the robot 300, the drivers 320A, 320B, and 320C drive the robot 300.

In addition, in the accommodation member 310, for example, a signal processing module for processing a signal that is based on data received in the receiving device 200 (signal corresponding to a signal acquired from a sensor) may be provided.

As described above, the receiving device 200 receives data transmitted from the transmission device 100 by simplex communication, and deserializes the data.

FIG. 4 illustrates an example where a substrate on which an IC functioning as the receiving device 200 is mounted is provided in the accommodation member 310.

Note that, in a robot to which the transmission system according to the present embodiment is applied, a position where the receiving device 200 is provided is not limited to the accommodation member 310.

For example, in a robot to which the transmission system according to the present embodiment is applied, the receiving device 200 may be provided on the base 302 by a substrate on which an IC functioning as the receiving device 200 is mounted, being disposed on the base 302.

In addition, in a robot to which the transmission system according to the present embodiment is applied, the receiving device 200 can be provided at an arbitrary position not provided on the robot arm 306, for example. As described above, by the receiving device 200 not being provided on the robot arm 306, weight saving of the robot arm 306 (further specifically speaking, weight saving of the tip portion (A illustrated in FIG. 4) on the other end side of the robot arm 306.) can be achieved.

The transmission system 1000 is applied to the robot 300 as illustrated in FIG. 4, for example.

The robot 300 illustrated in FIG. 4 includes the transmission device 100 and the receiving device 200. Therefore, in the robot 300 illustrated in FIG. 4, the following effects are caused.

Wire saving in the robot 300 is achieved

The detection of break of a signal line in the robot 300 becomes easy

Lower delay in the transmission of data of a change amount in the robot 300 is achieved By lower delay being achieved, for example, influence on controllability of the robot 300 that is attributed to a phase lag in a detect value of a sensor (a value indicated by data of a change amount) can be reduced.

In addition, reducing mass of the tip of an operational portion of a robot such as the tip portion (A illustrated in FIG. 4) on the other end side of the robot arm 306 that is illustrated in FIG. 4 has many advantages such as, for example, enhancement in controllability that is caused by a decrease in moment, and downsizing and weight saving of a drive mechanism and a machine structure that are caused by a reduction in force required for driving.

Here, in the robot 300 illustrated in FIG. 4, the transmission device 100 is provided at the tip portion (A illustrated in FIG. 4) on the other end side of the robot arm 306, and the receiving device 200 is not provided on the robot arm 306. Therefore, in the robot 300, the drivers 320A, 320B, and 320C and the signal processing module are provided in portions other than the operational portion of the robot, such as the inside of the accommodation member 310.

In addition, by "the configuration in which the transmission device 100 is provided at the tip portion (A illustrated in FIG. 4) on the other end side of the robot arm 306, and the receiving device 200 is not provided on the robot arm 306", in the robot 300 illustrated in FIG. 4, the following effects are further caused.

Enhancement in controllability that is caused by a decrease in moment, and downsizing and weight saving of a drive mechanism and a machine structure that are caused by a reduction in force required for driving are achieved Weight saving of a tip structure of the robot arm 306 included in the robot 300 (structure of the tip portion on the other end side of the robot arm 306) is achieved Here, as illustrated in FIG. 4, when "a configuration in which the transmission device 100 is provided at the tip portion (A illustrated in FIG. 4) on the other end side of the robot arm 306, and the receiving device 200 is not provided on the robot arm 306" is employed, when a case where the transmission device 100 and the receiving device 200 are connected in a wired manner by a signal line is assumed, due to an increase in the number of wires, for example, it is considered that the following disadvantages (demerits) can be generated.

As the number of wires increases, a movement of a tip structure is restricted, and tensional force load (disturbance element) is applied As the number of wires increases, layout of wires becomes difficult As the number of wires increases, a possibility of break of wires becomes higher Nevertheless, in the robot 300, because wire saving is achieved as described above, a possibility of occurrence of the above-described disadvantages that can be generated due to an increase in the number of wires is reduced.

As described above, by the transmission system according to the present embodiment being applied to a robot, weight saving of mass of a tip of an operational portion of the robot, and wire saving can be both achieved. In addition, by weight saving of mass of the tip of the operational portion of the robot, and wire saving being both achieved, it becomes possible to further facilitate robot development.

Note that, needless to say, a robot to which the transmission system according to the present embodiment is applied is not limited to the example illustrated in FIG. 4.

[II] Other Application Examples

An application example of the transmission system according to the present embodiment is not limited to a robot.

The transmission system according to the present embodiment can be applied to an arbitrary device that includes one or two or more sensors, and uses data that is based on signals output from the sensors, such as, for example, "a movable body such as an automobile that includes one or two or more sensors" and "a television receiver including one or two or more sensors".

In addition, the transmission system according to the present embodiment can be applied to an arbitrary system including a device including one or two or more sensors, such as, for example, "a controller and a game machine main body that are provided with one or two or more sensors" and "a computer such as a fixed-point sensor and a server that are provided with one or two or more sensors", and a processing device that processes data that is based on a signal output from a sensor.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A transmission device configured to serialize data of a change amount that is based on a signal acquired from a sensor, and transmit the data by simplex communication.

(2)

The transmission device according to (1), including:

a serializer configured to serialize the data of the change amount, and transmit the serialized data by the simplex communication.

(3)

The transmission device according to (1) or (2), including:

an analog-to-digital conversion circuit configured to convert a signal into a digital signal, the signal being acquired from the sensor that outputs an analog signal, in which the data of the change amount that is to be serialized is data converted by the analog-to-digital conversion circuit.

(4)

The transmission device according to (3), in which the analog-to-digital conversion circuit is a delta sigma type analog-to-digital converter.

(5)

The transmission device according to any one of (1) to (4), in which the data of the change amount that is to be serialized is a signal acquired from the sensor that outputs a digital signal.

(6)

The transmission device according to any one of (1) to (5), in which the sensor includes an incremental encoder.

(7)

The transmission device according to any one of (1) to (6), in which the simplex communication is wired communication.

(8)

A transmission system including:

a transmission device configured to serialize data of a change amount that is based on a signal acquired from a sensor, and transmit the data by simplex communication; and a receiving device configured to receive data transmitted by the simplex communication, and deserialize the data.

(9)

The transmission system according to (8), in which the sensor and the transmission device are provided in a robot including a robot arm having one end connected to a main body and another end that is made movable, on the other end side of the robot arm, and the receiving device is not provided on the robot arm.

(10)

A robot including:

a robot arm having one end connected to a main body, another end that is made movable, and a sensor provided on the other end side;

a transmission device that is provided on the other end side of the robot arm, and configured to serialize data of a change amount that is based on a signal acquired from the sensor, and transmit the data by simplex communication; and a receiving device configured to receive data transmitted by the simplex communication, and deserialize the data.

(11)

The robot according to (10), in which the receiving device is provided in an accommodation member connected to the main body, and accommodating a driver configured to drive the robot.

(12)

The robot according to (10), in which the receiving device is provided on a base supporting the main body.

REFERENCE SIGNS LIST 10, 100 transmission device
12, 102 analog-to-digital conversion circuit
14, 206 encoder position acquisition circuit
16 bus control circuit
18 serial bus control circuit
104 serializer
110 delta sigma type analog-to-digital converter
200 receiving device
202 deserializer
204 digital-to-analog conversion circuit
300 robot
302 base
304 main body
306 robot arm
308 sensor
310 accommodation member
1000 transmission system

The invention claimed is:

1. A transmission device comprising:
one or more sensors, wherein at least a first sensor of the one or more sensors produces an analog signal output;
an analog-to-digital conversion circuit configured to convert the analog signal from the first sensor into a digital signal, wherein a change amount of the analog signal is converted by the analog-to-digital conversion circuit into the digital signal; and
a serializer configured to serialize the digital signal representing the change amount that is based on the analog signal acquired from the first sensor, and transmit the data by simplex communication.

2. The transmission device according to claim 1, wherein the analog-to-digital conversion circuit is a delta sigma type analog-to-digital converter.

3. The transmission device according to claim 1, wherein the serializer is further configured to serialize data of a change amount from a second sensor and transmit the serialized data by simplex communication, wherein the second sensor outputs a digital signal.

4. The transmission device according to claim 3, wherein the second sensor includes an incremental encoder.

5. The transmission device according to claim 1, wherein the simplex communication is wired communication.

6. A transmission system comprising:
a transmission device configured to serialize data of a change amount that is based on a signal acquired from a sensor, and transmit the data by simplex communication; and
a receiving device configured to receive data transmitted by the simplex communication, and deserialize the data.

7. The transmission system according to claim 6, wherein the sensor and the transmission device are provided in a robot including a robot arm having one end connected to a main body and another end that is made movable, on the other end side of the robot arm, and the receiving device is not provided on the robot arm.

8. A robot comprising:
- a robot arm having one end connected to a main body, another end that is made movable, and a sensor provided on the other end side;
- a transmission device that is provided on the other end side of the robot arm, and configured to serialize data of a change amount that is based on a signal acquired from the sensor, and transmit the data by simplex communication; and
- a receiving device configured to receive data transmitted by the simplex communication, and deserialize the data.

9. The robot according to claim 8, wherein the receiving device is provided in an accommodation member connected to the main body, and accommodating a driver configured to drive the robot.

10. The robot according to claim 8, wherein the receiving device is provided on a base supporting the main body.

* * * * *